US011470727B2

(12) United States Patent
Liedtke (10) Patent No.: US 11,470,727 B2
(45) Date of Patent: Oct. 11, 2022

(54) APPARATUS AND METHOD RELATING TO ELECTROCHEMICAL MIGRATION (71) Applicant: JAGUAR LAND ROVER LIMITED, Warwickshire (GB)

(72) Inventor: Thomas Liedtke, Coventry (GB)

(73) Assignee: JAGUAR LAND ROVER LIMITED, Coventry (GB)

(*) Notice: Subject to any disclaimer, the term of this patent is extended or adjusted under 35 U.S.C. 154(b) by 608 days.

(21) Appl. No.: 16/336,670

(22) PCT Filed: Oct. 23, 2017

(86) PCT No.: PCT/EP2017/076995
§ 371 (c)(1),
(2) Date: Mar. 26, 2019

(87) PCT Pub. No.: WO2018/077798
PCT Pub. Date: May 3, 2018

(65) Prior Publication Data
US 2021/0289636 A1    Sep. 16, 2021

(30) Foreign Application Priority Data

Oct. 24, 2016 (GB) .................................. 1617899
Oct. 24, 2016 (GB) .................................. 1617900

(51) Int. Cl.
*H05K 1/00* (2006.01)
*H05K 1/02* (2006.01)
(Continued)

(52) U.S. Cl.
CPC ......... *H05K 3/3473* (2013.01); *B23K 35/262* (2013.01); *B23K 35/302* (2013.01);
(Continued)

(58) Field of Classification Search
CPC .. H05K 1/00; H05K 1/02; H05K 1/09; H05K 1/11; H05K 1/20; H05K 3/10;
(Continued)

(56) References Cited

U.S. PATENT DOCUMENTS 4,491,655 A * 1/1985 Sandstrom ................ C08L 9/06
524/270
4,938,801 A * 7/1990 Yoshioka ................ C09D 11/02
106/31.4
(Continued)

FOREIGN PATENT DOCUMENTS

EP    2309247 A1    4/2011
EP    2426478 A1    3/2012
(Continued)

OTHER PUBLICATIONS

Combined Search and Examination Report under Sections 17 and 18(3) for Application No. GB1617899.8 dated Feb. 13, 2017.
(Continued)

*Primary Examiner* — Xiaoliang Chen
(74) *Attorney, Agent, or Firm* — Carlson, Gaskey & Olds, P.C.

(57) ABSTRACT

Embodiments of the present invention provide a method (1000) of assembling an electrical circuit comprising one or more copper electrical conductors, the method comprising plating (1010) a surface of the one or more conductors with a layer comprising tin; annealing the plating; applying (1020) solder to at least a portion of the one or more electrical conductors, wherein said solder comprises tin and copper; and annealing the electrical circuit.

20 Claims, 7 Drawing Sheets

(51) Int. Cl.
| | |
|---|---|
| H05K 1/09 | (2006.01) |
| H05K 1/11 | (2006.01) |
| H05K 3/10 | (2006.01) |
| H05K 5/00 | (2006.01) |
| B32B 15/00 | (2006.01) |
| B32B 15/01 | (2006.01) |
| B32B 15/04 | (2006.01) |
| H01L 21/28 | (2006.01) |
| H01L 21/58 | (2006.01) |
| H01L 21/3205 | (2006.01) |
| H01L 23/06 | (2006.01) |
| H05K 3/34 | (2006.01) |
| B23K 35/26 | (2006.01) |
| B23K 35/30 | (2006.01) |
| G01R 31/28 | (2006.01) |

(52) U.S. Cl.
CPC ........... *G01R 31/2817* (2013.01); *H05K 1/09* (2013.01); *H05K 3/3463* (2013.01); *H05K 2201/0305* (2013.01); *H05K 2201/0769* (2013.01); *H05K 2203/1105* (2013.01); *H05K 2203/162* (2013.01)

(58) Field of Classification Search
CPC ...... H05K 3/3457; H05K 3/3473; H05K 5/00; H05K 7/06; H05K 7/10; B32B 15/00; B32B 15/01; B32B 15/04; H01L 21/28; H01L 21/58; H01L 21/3205; H01L 23/06
USPC ........ 174/263, 257, 258; 428/457, 615, 620, 428/646, 647; 257/737; 438/108, 121, 438/613, 614; 228/101, 176, 194, 203, 228/245, 246, 256
See application file for complete search history.

(56) References Cited

U.S. PATENT DOCUMENTS

| | | | | |
|---|---|---|---|---|
| 6,187,114 B1* | 2/2001 | Ogashiwa | ............ | B23K 35/262 148/400 |
| 7,075,183 B2* | 7/2006 | Soga | ........................ | H01L 24/13 257/772 |
| 7,425,759 B1* | 9/2008 | Lin | ........................ | H01L 21/486 257/696 |
| 7,453,140 B1* | 11/2008 | Lin | ................... | H01L 23/49827 257/673 |
| 7,459,385 B1* | 12/2008 | Lin | ..................... | H01L 23/3128 438/612 |
| 7,465,651 B2* | 12/2008 | Agraharam | ....... | H01L 23/49811 438/597 |
| 7,722,962 B2* | 5/2010 | Soga | ........................ | H01L 24/01 428/620 |
| 7,932,165 B1* | 4/2011 | Lin | ..................... | H01L 23/3128 438/464 |
| 8,157,158 B2* | 4/2012 | Gruber | ................. | H05K 3/3463 228/179.1 |
| 8,220,692 B2* | 7/2012 | Ohnishi | ................... | C22C 13/00 228/56.3 |
| 8,713,792 B2* | 5/2014 | Sakai | ...................... | H01L 24/81 29/843 |
| 9,066,435 B2* | 6/2015 | Terui | ..................... | H05K 3/305 |
| 9,362,887 B2* | 6/2016 | Shealy | ................... | H01L 41/29 |
| 9,527,167 B2* | 12/2016 | Ohnishi | ................... | B23K 35/26 |
| 9,571,061 B2* | 2/2017 | Shealy | .................... | H03H 9/542 |
| 9,700,963 B2* | 7/2017 | Ohnishi | .................. | B23K 35/0222 |
| 10,211,804 B2* | 2/2019 | Shealy | .................... | H03H 9/0095 |
| 2002/0090756 A1* | 7/2002 | Tago | ........................ | H01L 24/13 438/108 |
| 2002/0121709 A1 | 9/2002 | Matsuki et al. | | |
| 2003/0052157 A1* | 3/2003 | Wunderlich | ........... | H05K 3/243 228/254 |
| 2003/0168499 A1* | 9/2003 | Tanabe | ................. | B23K 3/0653 228/260 |
| 2003/0186597 A1* | 10/2003 | Suzuki | ................... | H01R 13/03 439/886 |
| 2004/0118586 A1* | 6/2004 | Hua | ................... | H05K 3/3436 174/521 |
| 2005/0067189 A1* | 3/2005 | Tanabe | ................. | H05K 3/3415 174/260 |
| 2005/0115602 A1* | 6/2005 | Senta | ................ | H01L 31/03845 136/250 |
| 2005/0224966 A1* | 10/2005 | Fogel | ..................... | H01L 24/11 257/737 |
| 2006/0049521 A1* | 3/2006 | Kayukawa | .............. | H01L 24/83 257/737 |
| 2006/0237225 A1* | 10/2006 | Kariya | ..................... | H01L 24/06 174/260 |
| 2006/0272853 A1* | 12/2006 | Muramatsu | ....... | H01L 23/49822 257/E23.079 |
| 2007/0107214 A1* | 5/2007 | Tanabe | ................. | B23K 3/0653 29/852 |
| 2007/0117475 A1* | 5/2007 | Tu | ..................... | H01L 23/49582 439/884 |
| 2007/0176293 A1* | 8/2007 | Kayukawa | .............. | H01L 24/83 257/772 |
| 2007/0256856 A1* | 11/2007 | Ichikawa | .................. | C25D 3/30 174/257 |
| 2008/0079125 A1* | 4/2008 | Lu | ......................... | H01L 23/433 257/675 |
| 2008/0157395 A1* | 7/2008 | Belanger | ................. | H01L 24/05 257/778 |
| 2008/0182124 A1* | 7/2008 | Gruber | ................. | B23K 35/262 428/646 |
| 2008/0292492 A1* | 11/2008 | Ingham | ................... | C22C 13/00 420/561 |
| 2008/0316721 A1* | 12/2008 | Maki | ....................... | H05K 3/244 361/760 |
| 2009/0090543 A1 | 4/2009 | Furuyama et al. | | |
| 2009/0197103 A1* | 8/2009 | Shih | ........................ | B23K 1/008 428/457 |
| 2009/0197114 A1* | 8/2009 | Shih | ..................... | B23K 1/0016 428/647 |
| 2009/0288862 A1* | 11/2009 | Tamura | ................. | H01L 23/498 174/257 |
| 2010/0052162 A1* | 3/2010 | Iijima | ..................... | H01L 24/11 257/737 |
| 2010/0307292 A1* | 12/2010 | Nishimura | ........... | B23K 35/262 75/628 |
| 2010/0319967 A1* | 12/2010 | Amin | ..................... | H05K 3/244 174/257 |
| 2011/0031002 A1* | 2/2011 | Sakai | ................... | H01L 23/49866 174/257 |
| 2011/0151322 A1* | 6/2011 | Joo | ....................... | H01M 4/134 429/209 |
| 2011/0297433 A1* | 12/2011 | Kuramoto | ........... | H01L 21/6835 174/263 |
| 2011/0303448 A1 | 12/2011 | Anderson et al. | | |
| 2011/0318918 A1* | 12/2011 | Kitamura | ................. | H01L 24/11 438/614 |
| 2012/0152600 A1* | 6/2012 | Nishioka | ............... | H05K 3/3452 174/258 |
| 2012/0201596 A1* | 8/2012 | Gruber | ................. | B23K 35/262 403/272 |
| 2012/0205425 A1* | 8/2012 | Gruber | ................. | H05K 3/3463 228/223 |
| 2012/0280023 A1* | 11/2012 | Amin | ..................... | B23K 1/203 228/176 |
| 2012/0321907 A1* | 12/2012 | Hoivik | ............... | B81C 1/00269 428/615 |
| 2013/0068513 A1* | 3/2013 | Hirai | ....................... | H05K 3/10 174/257 |
| 2013/0143364 A1* | 6/2013 | Lin | ......................... | H01L 24/81 438/121 |
| 2014/0061287 A1* | 3/2014 | Ohnishi | ................ | H05K 3/3463 228/246 |
| 2014/0111956 A1* | 4/2014 | Taniguchi | ............... | H01L 24/32 361/771 |

(56) References Cited

U.S. PATENT DOCUMENTS

| | | | | |
|---|---|---|---|---|
| 2014/0183733 A1* | 7/2014 | Chu | ................. | B23K 35/282 |
| | | | | 257/738 |
| 2014/0202739 A1* | 7/2014 | Sakai | ................. | H01L 24/81 |
| | | | | 174/251 |
| 2015/0078810 A1 | 3/2015 | Koep et al. | | |
| 2015/0264817 A1* | 9/2015 | Terui | ................. | H01L 25/50 |
| | | | | 438/107 |
| 2015/0357993 A1* | 12/2015 | Shealy | ................. | H03H 9/568 |
| | | | | 310/321 |
| 2016/0208074 A1* | 7/2016 | Ogi | ................. | C08K 3/36 |
| 2016/0248395 A1* | 8/2016 | Shealy | ................. | H03H 9/54 |
| 2016/0309600 A1* | 10/2016 | Kajiwara | ................. | H05K 5/0069 |
| 2016/0339543 A1* | 11/2016 | Ohnishi | ................. | B23K 35/0222 |
| 2018/0233832 A1* | 8/2018 | Lyon | ................. | H01R 4/023 |

FOREIGN PATENT DOCUMENTS

| | | |
|---|---|---|
| GB | 2383552 A | 7/2003 |
| JP | 2513604 B2 | 7/1996 |
| WO | 2009/038565 A1 | 3/2009 |

OTHER PUBLICATIONS

International Search Report and Written Opinion of the International Searching Authority for International application No. PCT/EP2017/076995 dated Apr. 6, 2018.

Combined Search and Examination Report under Sections 17 and 18(3) for Application No. GB1617900.4 dated Mar. 1, 2017.

\* cited by examiner

APPARATUS AND METHOD RELATING TO ELECTROCHEMICAL MIGRATION

TECHNICAL FIELD

The present disclosure relates to a method and apparatus and particularly, but not exclusively, to a method of assembling an electrical circuit. Aspects of the invention relate to a method, to an apparatus, and to a system and to computer software.

BACKGROUND

Electrochemical migration (ECM) is problematic for electrical circuitry. ECM is an electrochemical process whereby metal ions move in the presence of an applied voltage between metal conductors through an electrolyte solution. ECM at a positive electrode leads to oxidation of the electrode, whereas for a negative electrode cations are reduced by an intake of electrons to form metal atoms. Where a compressive force is applied, such as to solder or plating materials, dendrites or whiskers, sometimes known as tin whiskers, may be formed although the problems are not limited to specific metals. Over time, the dendrites can grow between contacts in an electrical circuit, leading to a short circuit. At first, the dendrite may 'blow' or burn through due to electric current flow. However over a period time, the blown dendrites re-grow due to further ECM, eventually filling a space between the contacts in the electrical circuit to form a permanent short-circuit. As can be appreciated, such short-circuits may disable the electrical circuit. However testing for the effects of ECM is time consuming. ECM is also difficult to prevent. Conformal coatings for electrical circuits are typically used to prevent ingress from the electrolyte. However these coatings may be expensive. Furthermore, conformal coatings may not be applied everywhere, such as to some sensors, for example optical sensors, or to connectors.

It is an object of embodiments of the invention to at least mitigate one or more of the problems of the prior art.

SUMMARY OF THE INVENTION

Aspects and embodiments of the invention provide a method, an apparatus, a system and computer software as claimed in the appended claims.

According to an aspect of the present invention, there is provided a method of testing electrical circuitry, comprising thermally connecting electrical circuitry to a thermal reservoir, monitoring, during a test period, one or more electrical properties of the electrical circuitry with said electrical circuitry housed in a test chamber, controlling an environment of the test chamber, such that the electrical circuitry is caused, during at least a portion of the test period, to have a temperature below a dew point within the test chamber to cause condensation to form on the electrical circuitry. The method has an advantage that it may be used to simulate resistance of the electrical circuitry to electrochemical migration.

According to an aspect of the present invention, there is provided a method of testing electrical circuitry, the method comprising thermally associating electrical circuitry to a thermal reservoir, monitoring, during a test period, one or more electrical properties of the electrical circuitry with said electrical circuitry housed in a test chamber, controlling a temperature of the test chamber, such that the temperature varies during the test period and condensation is caused to form on the electrical circuitry during at least a portion of the test period by a temperature differential between the electrical circuitry and a test chamber. The method is beneficial in that it may be used to simulate resistance of the electrical circuitry to electrochemical migration.

According to an aspect of the present invention, there is provided a method for testing electrical circuitry, the method comprising thermally associating electrical circuitry with a thermal reservoir with said electrical circuitry housed within a test chamber, monitoring, during a test period, one or more electrical properties of the electrical circuitry, and controlling a temperature of the test chamber, such that the temperature varies during the test period and a temperature of the electrical circuit is caused to lag that of the environment within the test chamber such that condensation is caused to form on the electrical circuitry during at least a portion of the test period by a temperature differential between the electrical circuitry and the environment within the test chamber. Advantageously the method causes the condensation to form in a convenient manner due to the temperature of the electrical circuit lagging that of the environment.

The temperature of the test chamber may be controlled to vary according to a predetermined test profile. Advantageously the use of a test profile allows a repeatable test to be performed. The method may comprise repeating the predetermined test profile. Advantageously, repetitions of the test profile may be used to provide an extended-duration test for ECM.

The condensation may be caused to form on the electrical circuitry during at least one portion of the test period by an increase in temperature of the test chamber, such that a temperature of the electrical circuitry is below a temperature of the environment within the test chamber. Advantageously the lower temperature of the electrical circuitry encourages condensation formation thereon.

The method may comprise controlling a humidity of the environment within the test chamber. This provides the advantage that the humidity may be controlled to promote condensation formation on the electrical circuitry.

The environment is optionally controlled to have a humidity of at least 50% relative humidity during a major portion of the test period. Advantageously high humidity encourages condensation formation. The major portion may be a majority of the duration of the test period. The humidity may be at least 75% or around 80%.

The predetermined test profile may comprise a first portion of generally increasing temperature. Advantageously during the increasing temperature the electrical circuitry may be at a lower temperature, thus condensation may form thereon. The test profile may comprise a second portion of generally decreasing temperature. Advantageously the decreasing temperature may allow condensation formation or a coalescence of condensation on the electrical circuitry.

The predetermined test profile optionally comprises a third portion of generally constant temperature between the first and second portions. Advantageously the constant temperature may allow conditions within the test chamber or associated with the electrical circuitry to stabilise.

The predetermined test profile may comprise a fourth portion of generally constant temperature prior to the first portion. Optionally a temperature of the fourth portion is around 10° C. Advantageously the constant temperature may allow conditions within the test chamber or associated with the electrical circuitry to stabilise.

The thermal reservoir may comprise a metallic structure. The metallic structure may advantageously store thermal energy and be resistant to conditions within the test chamber.

The reservoir may comprise a structure formed predominantly from stainless steel. Advantageously stainless steel may be inert and oxidisation resistant.

The first portion of the predetermined test profile may generally increase in temperature at a rate of between 0.5 and 1.5° C. per minute. Advantageously such an increase in temperature allows the test to be performed in a convenient time whilst allowing a temperature differential. The second portion of the predetermined test profile may generally decrease in temperature at a rate of between 0.5 and 1.5° C. per minute. Advantageously such an increase in temperature allows the test to be performed in a convenient time whilst allowing a temperature differential.

The monitoring optionally comprises determining an electrical conductance of one or more portions of the electrical circuitry. Measuring electrical conductance may be a convenient way to monitor the electrical circuitry.

The electrical circuitry may comprise one or a plurality of branches. Advantageously each branch allows separate monitoring for ECM. Each branch may comprise a plurality of spaced-apart conductors. Advantageously the spaced apart conductors allow for monitoring of whisker or dendrite growth. The electrical conductance between the spaced-apart conductors may be determined during the test period. Advantageously the formation of whiskers causes a change in the conductance. The spaced-apart conductors are optionally spaced apart by 1.5 mm or less. Advantageously the distance allows for whisker formation in a convenient test time. The conductors may be on the surface of the electrical circuitry.

Each branch may comprise a resistance in series with the spaced-apart conductors. The resistance advantageously prevents a short-circuit due to whisker formation and provides a monitorable electrical component. The monitoring may comprise determining a voltage drop across the resistance during the test period. The voltage drop may be easily measured.

The electrical circuitry may comprise a plurality of branches, each branch comprising a plurality of spaced-apart conductors.

The one or more electrical properties of the electrical circuitry may be monitored at a rate of at least 1 kHz. Advantageously high-frequency monitoring allows whisker formation to be monitored which may 'blow' due to current conductance.

The monitoring is for determining a growth of dendrites between portions of the electrical circuitry.

The condensation may be caused to form on the electrical circuitry during at least one portion of the test period by a decrease in temperature of the test chamber, such that a temperature of the electrical circuitry is above the temperature of the test chamber.

The method may comprise applying an electrolyte solution to the electrical circuitry. The electrolyte solution may comprise sodium chloride (NaCl). The NaCl may be in the range 1-10 wt % of the solution. The NaCl may be in the range 1-5.5 wt % of the solution. Advantageously the electrolyte allows ions to be communicated.

According to another aspect of the present invention there is provided an apparatus, comprising output means for outputting an environment control signal for controlling at least a temperature of an environment within a test chamber having electrical circuitry contained therein, wherein the electrical circuitry is thermally associated with a thermal reservoir, input means for receiving a signal indicative of one or more electrical properties of the electrical circuitry, control means arranged to control the environment control signal such that at least the temperature of the test chamber is controlled to vary during at least a portion of a test period, and condensation is caused to form on the electrical circuitry during at least a portion of the test period by a temperature differential between the electrical circuitry and the environment within the test chamber, the control means being arranged to monitor the one or more electrical properties of the electrical circuitry during at least a portion of the test period.

According to another aspect of the present invention there is provided an apparatus, comprising output means for outputting an environment control signal for controlling at least a temperature of an environment within a test chamber having electrical circuitry contained therein, wherein the electrical circuitry is thermally associated with a thermal reservoir, input means for receiving a signal indicative of one or more electrical properties of the electrical circuitry, control means arranged to control the environment control signal such that at least the temperature of the test chamber is controlled to vary during at least a portion of a test period and a temperature of the electrical circuitry is caused to lag that of the environment within the test chamber such that condensation is caused to form on the electrical circuitry during at least a portion of the test period by a temperature differential between the electrical circuitry and the environment within the test chamber, and wherein the control means is arranged to monitor the one or more electrical properties of the electrical circuitry during at least a portion of the test period.

In the apparatus described above,
  the input means may comprise an electrical input for receiving the signal indicative of one or more electrical properties of the electrical circuitry;
  the output means may comprise an electrical output for outputting the environment control signal; and
  the control means may comprise one or more control devices, for example without limitation a controller, an electronic circuit, an electronic control unit or a processor. The one or more control devices may receive an electrical signal indicative of the one or more electrical properties of the electrical circuitry.

The control means may be arranged to control the temperature of the test chamber to vary according to a predetermined test profile. Optionally the predetermined test profile is cyclically repeating.

The environment control signal may be arranged to control a humidity of the environment within the test chamber. Optionally the control means is arranged to control the humidity of the environment within the test chamber. The humidity may be controlled to be at least 50% relative humidity for a major portion of the test period.

The monitoring may comprise determining an electrical conductance of one or more portions of the electrical circuitry.

The one or more electrical properties of the electrical circuitry may be monitored at a rate of at least 1 kHz.

According to another aspect of the present invention there is provided a system for testing electrical circuitry, the system comprising an apparatus according to an aspect of the invention described herein, a test chamber having temperature control means associated therewith, the temperature control means being arranged to receive the temperature signal from the apparatus and to control the temperature of the test chamber in dependence thereon, a thermal reservoir associated with the test chamber for thermally associating with electrical circuitry in the test chamber, monitoring means connected to the electrical circuitry to monitor one or more electrical properties of the electrical circuitry with said electrical circuitry housed in the test chamber.

In the system described above, the temperature control means may comprise a temperature control device; and the monitoring means may comprise a monitoring device.

The thermal reservoir may be located in the test chamber.

The electrical circuitry is optionally located upon the thermal reservoir.

The electrical circuitry may be electrically insulated from the thermal reservoir.

According to another aspect of the present invention there is provided computer software which, when executed by a computer, is arranged to perform a method according to an aspect of the invention described herein. The computer software may be stored on a non-transitory computer readable medium. The computer software may be tangibly stored on a non-transitory computer readable medium.

According to a yet further aspect of the present invention there is provided a method of assembling an electrical circuit comprising one or more copper electrical conductors, the method comprising plating a surface of the one or more conductors with a layer comprising tin, and applying solder to at least a portion of the one or more electrical conductors, wherein said solder comprises tin and copper. Advantageously the electrical circuit has improved resistance to one or both of ECM and dendrite growth.

The method may comprise annealing the electrical circuit having the solder applied to the at least a portion of the one or more electrical conductors at a temperature of up to around 150° C. The annealing may be in the temperature range 130° C. to 170° C., or between 140° C. and 160° C. The annealing may be performed for around an hour. The annealing may be an air temperature of the annealing. Advantageously the anneal temperature may increase a metal ion activation energy.

According to a yet further aspect of the present invention there is provided a method of assembling an electrical circuit comprising one or more copper electrical conductors, the method comprising plating a surface of the one or more conductors with a layer comprising tin, annealing the plating of the electrical circuit at a temperature of around 255° C., applying solder to at least a portion of the one or more electrical conductors, wherein said solder comprises tin and copper, and annealing the electrical circuit having the solder applied to the at least a portion of the one or more electrical conductors at a temperature of up to around 150° C. Advantageously the electrical circuit has improved resistance to one or both of ECM and dendrite growth.

The annealing of the electrical circuit having the solder applied may have a duration of between 45 minutes and 1.5 hours The method may comprise allowing the electrical circuit to cool following the annealing in an atmosphere at a temperature within a range of 10 to 40° C. Advantageously the natural cooling may provide low compressive stresses in the electrical circuit, which may aid prevention of dendrite formation.

The method optionally comprises cooling the electrical circuit following the annealing at a rate of less than 10° C./minute, or 9° C./minute, or 8° C./minute, or 7° C./minute, or 6° C./minute, or 5° C./minute or 4° C./minute. The rate of cooling may be greater than 0.5° C./minute, or 1° C./minute. The method optionally comprises cooling the electrical circuit following the annealing at a rate within a range of 1.8° C./minute to 3° C./minute. Advantageously the relatively low rate of cooling may reduce compressive stress in the electrical circuit.

The plating the surface of the one or more conductors may comprise annealing the plating of the electrical circuit at a temperature of at least 225° C. Advantageously the annealing temperature of the plating may improve resistance to one or both of ECM and dendrite growth.

The annealing the plating of the electrical circuit may be at a temperature of around between 240° C. and 270° C. The annealing of plating of the electrical circuit may be at a temperature of around 255° C.

The method may comprise allowing the electrical circuit to cool following the annealing of the plating in an atmosphere at a temperature within a range of 10 to 40° C. Advantageously the natural cooling may provide low compressive stresses in the electrical circuit, which may aid prevention of dendrite formation.

The method optionally comprises cooling the electrical circuit following the annealing of the plating at a rate of less than 10° C./minute, or 9° C./minute, or 8° C./minute, or 7° C./minute, or 6° C./minute, or 5° C./minute or 4° C./minute. The rate of cooling may be greater than 0.5° C./minute, or 1° C./minute. The method optionally comprises cooling the electrical circuit following the annealing at a rate within a range of 1.8° C./minute to 3° C./minute. Advantageously the relatively low rate of cooling may reduce compressive stress in the electrical circuit.

The solder may comprise copper in the range 0.5 wt % to 1 wt %. The solder may comprise around 0.7 wt % copper. The solder may comprise nickel in a range of 0.1 to 0.05 wt %. The solder may comprise about 0.07 wt % nickel. The solder may be at least 95 wt % tin. The solder may be around 99 wt % tin. The solder may be substantially free of silver. The solder optionally comprises Germanium. The solder may comprise germanium in the range 0.005% wt to 0.02% wt. The solder may comprise about 0.01 wt % germanium. Advantageously the composition of the solder may improve resistance of the electrical circuit to ECM.

The method may comprise applying a rosin-based flux to the electrical circuit. A reflow temperature of the flux optionally corresponds to the temperature of the annealing of the electrical circuit having the solder applied. Advantageously the flux assistants in preventing or at least reducing ECM.

The tin plating may have a thickness of less than or equal to 5 μm. The tin plating may have a thickness of less than or equal to 2 μm. The tin plating optionally has a thickness of around 1 μm. Advantageously the tin plating may be relatively thin, thus reducing weight and/or cost.

The surface of the one or more conductors may be directly plated with a layer substantially comprising tin. Advantageously intermediate processes and/or coatings are not required.

A first surface of the one or more electrical conductors may be disposed on an insulating substrate. The electrical circuit may advantageously be formed as a printed circuit board (PCB).

A second surface of the one or more electrical conductors opposing the first surface may be plated with tin. Advantageously exposed surfaces are plated with tin. Substantially all exposed copper surfaces on the insulating substrate may be plated within tin. Advantageously masking of portions of the copper surfaces is not required.

According to another further aspect of the present invention there is provided an electrical circuit produced by a method according to an aspect of the present invention.

Advantageously the electrical circuit has improved resistance to ECM and/or dendrite growth.

According to a yet still further aspect of the present invention there is provided an electrical circuit, comprising one or more copper electrical conductors having a tin plating, and solder comprising tin and copper applied to at least a portion of the one or more electrical conductors.

According to a yet further aspect of the present invention there is provided a method of assembling an electrical circuit comprising one or more copper electrical conductors, the method comprising plating a surface of the one or more conductors with a layer comprising tin, and applying solder to at least a portion of the one or more electrical conductors, wherein said solder comprises tin and copper and is substantially free of silver. Advantageously the absence of silver may reduce a likelihood of ECM occurring. The method may include features as described above.

According to a yet still further aspect of the present invention there is provided an electrical circuit, comprising one or more copper electrical conductors having a tin plating annealed at a temperature of around 255° C., and solder comprising tin and copper applied to at least a portion of the one or more electrical conductors and annealed at a temperature of up to around 150° C.

The solder optionally comprises copper in the range 0.5 wt % to 1 wt %. The solder may comprise around 0.7 wt % copper. The solder optionally comprises nickel in a range of 0.1 to 0.05 wt %. The solder may comprise about 0.7 wt % nickel. The solder may be at least 95 wt % tin. The solder may be around 99 wt % tin.

The tin plating may have a thickness of less than or equal to 5 µm. The tin plating may have a thickness of less than or equal to 2 µm. The tin plating may have a thickness of around 1 µm.

The electrical circuit may be a printed circuit board. The conductors may be printed circuit board tracks. The tin plating is optionally applied to a surface of the printed circuit board tracks. The tin plating may be applied to substantially all exposed copper surfaces of the printed circuit board.

The conductors of the electrical circuit may be without a conformal coating. The conductors of the electrical circuit may be bare metal.

According to a yet still further aspect of the present invention there is provided an electrical circuit, comprising one or more copper electrical conductors having a tin plating, and solder comprising tin and copper and which is substantially free of silver applied to at least a portion of the one or more electrical conductors. The electrical circuit may have features as described above.

According to a yet still further aspect of the present invention there is provided a vehicle comprising an electrical circuit according to an aspect of the invention. Advantageously a reliability of electrical circuits in the vehicle may be improved. A cost of producing the vehicle may be reduced. The vehicle may be advantageously tolerant to variable temperatures, such as encountered in movement from a cold environment to a warm environment.

According to a yet further aspect of the present invention, there is provided an electrical circuit, comprising one or more copper electrical conductors, at least a portion of the one or more electrical conductors having a coating comprising parylene. The parylene may be directly coated onto the copper. The conductors may be PCB tracks. Advantageously the electrical circuit has improved resistance to ECM and/or dendrite growth.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described by way of example only, with reference to the accompanying drawings, in which.

DETAILED DESCRIPTION

Figure 1:
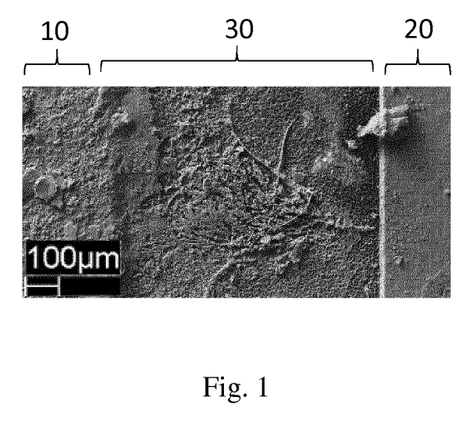
FIG. 1 shows an image of a printed circuit board having dendrites.

Referring to FIG. 1, there is illustrated an image of a printed circuit board (PCB) after a period of electrochemical migration (ECM). As will be appreciated, a PCB comprises a plurality of conductive tracks, generally formed of copper or aluminium, upon an insulating backing or board. The PCB illustrated in FIG. 1 comprises a first track 10 and a second track 20 which are separated by a region 30. In a manufacturing process, copper in the separating region 30 is etched away. Over a period of time, particularly where the PCB is subjected to moisture such as, although not exclusively, condensation, electrochemical migration can occur which leads to a growth of conductive dendrites from the metal on the PCB i.e. from the copper tracks 10, 20. Due to the relatively small distances between the tracks 10, 20 the conductive dendrites may causes shorts between the tracks 10, 20 which damage circuitry formed by the PCB such as electronic or electrical components mounted to the PCB. As can be seen in FIG. 1, the separating region 30 contains dendrites between the tracks 10, 20. It will be appreciated that ECM and dendrite formation can apply to metallic electrical circuit parts other than PCB tracks. However for ease of explanation reference will be made to PCBs with it being understood that this is not limiting.

Whilst the problem of ECM and dendrite formation is applicable to any electrical or electronic system, embodiments of the invention will be explained in reference to a vehicle, although it will be appreciated that this is only an example application. Vehicles contain many electrical and electronic systems formed on PCBs and including wires, terminals and other metallic components. Vehicles may be operated in a variety of conditions, such as weather conditions, and also at least partly i.e. for a period of time indoors such as in a garage or workshop. A vehicle may be stored in a garage which may be air-conditioned and thus cooler than an environment outside of the garage. When the vehicle is driven out of the garage it may experience a significant temperature increase. A temperature differential between the air and the electrical or electronic systems of the vehicle whereby the PCB is cooler than the air, causes condensation on the PCB which acts as a source of moisture and encourages ECM. Therefore ECM and consequent dendrite growth is a significant problem for vehicles, especially vehicles operated in hot countries where those vehicles may be stored indoors, although ECM is not limited to these situations.

Figure 2:
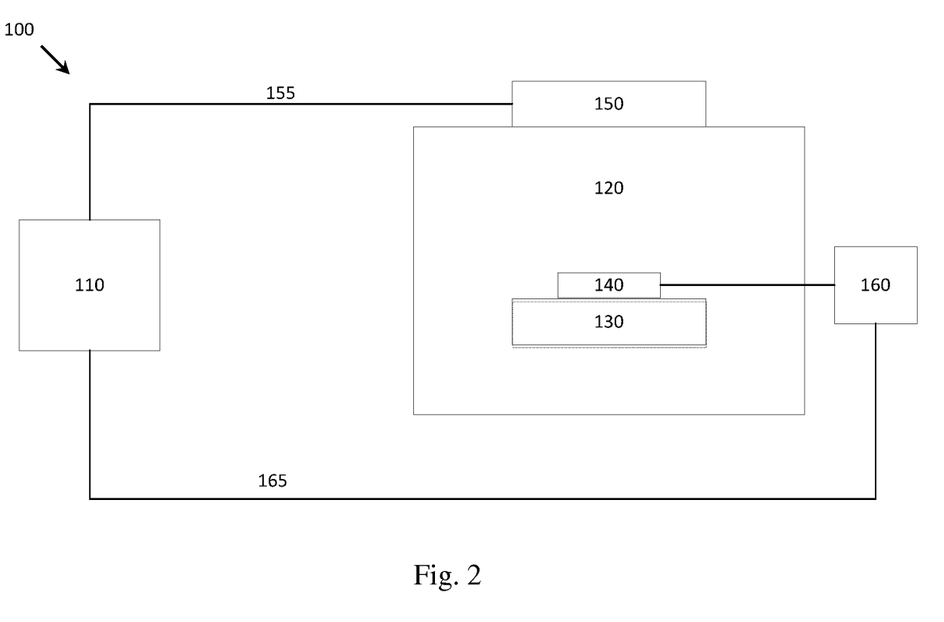
FIG. 2 shows an illustration of a system according to an embodiment of the invention.

FIG. 2 illustrates a system 100 for testing electrical circuitry according to an embodiment of the invention. The system 100 comprises a controller 110 according to an embodiment of the invention, a test chamber 120 having environmental control means 150 associated therewith, a thermal reservoir 130 associated with the test chamber 120 for thermally connecting to electrical circuitry 140, in use, in the test chamber 120 and monitoring means 160 connected, in use, to the electrical circuitry 140 for monitoring one or more electrical properties of the electrical circuitry 140. The environmental control means 150 is arranged to receive an environment control (EC) signal 155 from the controller 110 and to control one or more characteristics of an environment within the test chamber 120 in dependence thereon. The one or more characteristics may comprise one or both of a temperature and a humidity in the test chamber 120. The monitoring means 160 is arranged to monitor one or more electrical properties of the electrical circuitry 140 and to output a monitor signal 165 indicative of the one or more electrical properties of the electrical circuitry 140 to the controller 110. An example test chamber 120 comprising the environmental control means 150 is manufactured by Weiss Technik, although it will be appreciated that embodiments of the invention are not limited in this respect.

The environmental control means 150 may be an apparatus for controlling the one or more characteristics of the environment within the test chamber 120. The environmental control means 150 may comprise a temperature control device for one or both of heating and/or cooling the test chamber 120. The environmental control means 150 may comprise a humidity control device for controlling the humidity of the test chamber 120. In particular, the humidity control device may be arranged to operatively increase the humidity within the test chamber 120 to a humidity indicated by at least a portion of the EC signal 155. Whilst the environmental control means 150 is indicated in FIG. 1 as being a single unit, it will be appreciated that it may be formed by discrete units i.e. a separate unit for each of the temperature control device and the humidity control device. Furthermore, although in FIG. 1 the environmental control means 150 is illustrated as being external to the test chamber 120, it will be appreciated that it may be partly or wholly located within the test chamber 120.

The temperature control device may comprise one or both of a heating device and a cooling device for heating and cooling, respectively, an environment within the test chamber 120. The environment within the test chamber 120 may be filled with air in some embodiments. The humidity control device may be arranged to introduce water vapour into the environment within the test chamber in order control the humidity of the environment.

The monitoring means 160, in some embodiments, is arranged to measure at least one voltage in the electrical circuit 140. In some embodiments, the monitoring means comprises a voltage source for applying a predetermined voltage to the electrical circuit 140. The predetermined voltage may be a positive voltage. The predetermined voltage may be 10V or more in one embodiment. In one embodiment the predetermined voltage may be 20V or more, whilst in another embodiment the predetermined voltage is substantially 30V, although it will be realised that other voltages may be used. The monitoring means 160 may comprise one or more voltage measurement devices for each measuring a respective voltage in the electrical circuit 140. In some embodiments, each voltage measurement device is arranged to operatively measure the voltage in the circuit 140 and to output data forming a portion of the monitor signal 165 indicative of the measured voltage. Thus the monitor signal 165 may comprise data indicative of one or a plurality of voltages in the electrical circuit 140 in use. Each of the measured voltages may be considered, in some embodiments, to represent a respective channel of the monitor signal 165.

Figure 3:
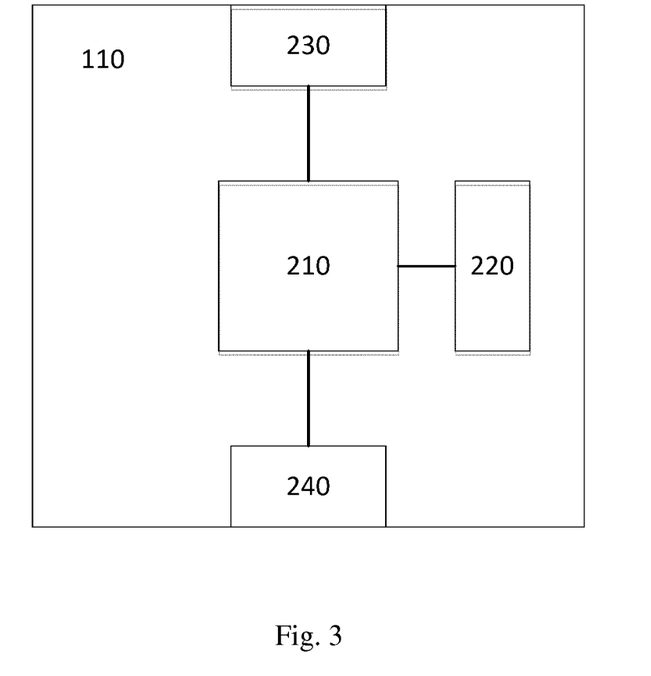
FIG. 3 shows an illustration of a controller according to an embodiment of the invention.

Referring to FIG. 3, the controller 110 comprises control means 210 arranged to control the one or more characteristics of the environment of the test chamber 120 during a test period. In some embodiments, the control means 210 is arranged to control one or both of the temperature and humidity of the test chamber 120, such that condensation is caused to form on the electrical circuitry 140 therein during at least a portion of the test period. The condensation may be formed by a temperature differential between the electrical circuitry 140 and the test chamber 120, particularly between the circuitry 140 and the environment within the test chamber 120. The humidity may be controlled to allow or promote the formation of the condensation, particularly by controlling the humidity of the test chamber 120 to be relatively high during at least a portion, or during a majority of the test period. Relatively high may be understood to mean at least 50% humidity or at least 75% humidity. The condensation is formed on the electrical circuitry 140 due to the electrical circuitry 140 being thermally connected to the thermal reservoir 130. Thus, during changes in the temperature of the environment within the test chamber 120, the temperature of the electrical circuit 140 is caused to lag that of the environment. For example, where the environment within the test chamber 120 is increased in temperature, the temperature of the electrical circuit 140 does not increase as quickly due to the thermal reservoir 130. Similarly, when the temperature of the environment within the test chamber 120 is caused to decrease the temperature of the electrical circuit 140 does not decrease as quickly due to the thermal reservoir 130. Thus a temperature differential is established, at times, between the environment and the electrical circuitry 140. The control means 210 is arranged to monitor the one or more electrical properties of the electrical circuitry 140 during the test period, as will be explained, to determine the presence of ECM on the electrical circuitry 140.

The control means 210 may be implemented by one or more electronic processors. The one or more processors may operatively execute computer software to carry out a method according to an embodiment of the invention, as will be explained. The computer software code may be stored in a memory means 220 accessible to the control means 210 which may be implemented by one or more memory devices such as one or more of RAM or ROM.

The controller 110 comprises output means 230 for outputting the EC signal 155 to control the environment of the test chamber 120. The output means 230 may be implemented by an electrical output from the controller 110 for outputting an electrical signal corresponding to the EC signal 155. The output means 230 operatively provides the EC signal to the environmental control means 150. The controller 110 comprises input means 240 for receiving a monitor signal 165 indicative of the one or more electrical properties of the electrical circuitry 140. The monitor signal 165 is operatively provided by the monitoring means 160 to the input means 240 of the controller 110. The input means 240 may be implemented by an electrical input to the controller 110 for receiving an electrical signal. In some embodiments, the output means 230 and input means 240 may be integrated into a single unit representing an input/output (I/O) means. In some embodiments the I/O means may be a network module for connecting the controller 110 to a data network, such as Ethernet, although other network protocols may be used. Each of the temperature control means 150 and the monitor means 160 may be connected to the network to receive and transmit data, respectively, to/from the controller 110.

The thermal reservoir 130 may be a metallic structure. The metallic structure may comprise metallic parts which are non-oxidising within the environment of the test chamber 120. The metallic structure may, in some embodiments, be a structure formed predominantly from stainless steel. In one embodiment, the metallic structure may be a metal plate, such as a stainless steel plate. In some embodiments the thermal reservoir 130 is located within the test chamber 120. The thermal reservoir 130 is thermally connected to the electrical circuitry 140 such that heat may be transferred between the thermal reservoir 130 and electrical circuit 140. The thermal reservoir has, in some embodiments, a greater heat storage capacity than the electrical circuit. In particular, if the electrical circuit is subjected to ambient air having a different temperature than the electrical circuit 140, the thermal reservoir 130 may cause the electrical circuit 140 to have a different temperature than the ambient air, at least for a period of time, due to heat stored in the thermal reservoir. Similarly, if the ambient air is warmer than the electrical circuit 140 the temperature of the electrical circuit 140 rises more slowly than the temperature of the ambient air due to heat energy being transferred to the thermal reservoir 130. Thus a temperature differential is caused between the electrical circuit 140 and the ambient air, at last for a period of time, due to the thermal reservoir 130. The electrical circuit 140 may be located on top of the thermal reservoir, but where the thermal reservoir 130 is electrically conductive, the electrical circuit 140 and thermal reservoir may be electrically insulated such as by having an insulating layer there-between.

Figure 4:
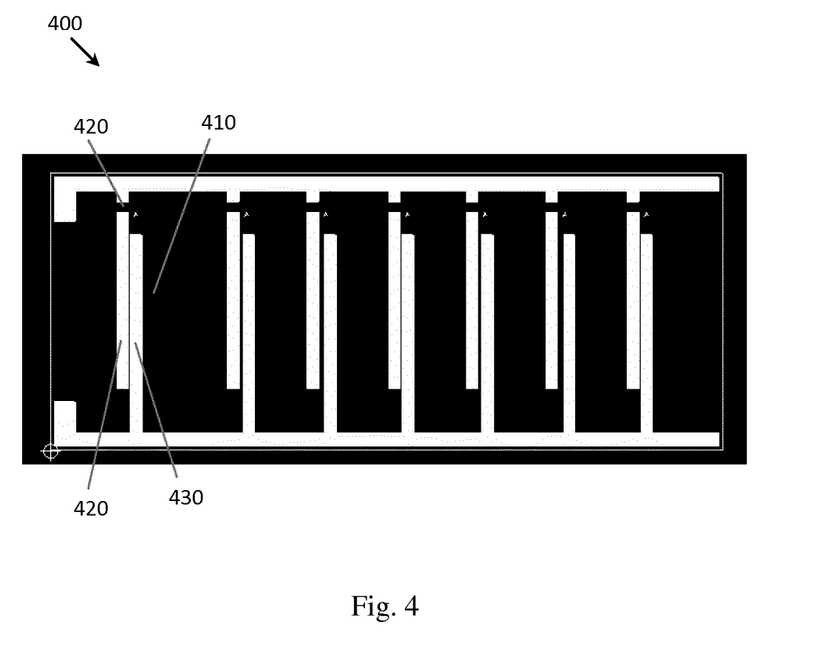
FIG. 4 shows an illustration of a test electrical circuit according to an embodiment of the invention.

FIG. 4 illustrates a test electrical circuit 400 according to an embodiment of the invention. The test electrical circuit is a circuit for testing for ECM and, particularly in some embodiments, for the formation of dendrites or 'metal whiskers' between metallic portions of the electrical circuit. The circuit is formed on at least one surface of a backing board and may be a PCB. It will be appreciated that the electrical circuit 400 may be formed on both sides of the board or PCB. The circuit 400 comprises one or more and, in the case of the circuit illustrated, a plurality of branches 410 (only one of which is numbered). Each branch 410 is used to independently test for ECM. Each branch 410 comprises a pair of spaced-apart conductors 420, 430 on a surface of the PCB. It will be appreciated that each branch may comprise more than two conductors. In the embodiment shown in FIG. 4, each conductor is elongate and arranged in a parallel orientation to its neighbouring conductor. Thus a constant width gap is provided between first 420 and second 430 conductors forming the pair 420, 430. The gap may have a width of between 0.15 mm and 2.5 mm. Other lower limits of spacing of, for example, 0.5 mm may be used. In some embodiments the gap is less than 1.5 mm. In one embodiment that gap between the conductors 420, 430 has a width of 1 mm. The conductance between the pair of spaced-apart conductors is monitored during the test period. It will be understood that determining the conductance is equivalent to determining resistance between the conductors. Each of the conductors is bare metal i.e. not covered by any form of protective coatings, to expose the metal to the environmental conditions within the test chamber 120 to determine the presence and extent of ECM to the electrical circuit 140. In its original, as manufactured, state the branch is open-circuit as the first and second conductors 420, 430 of each branch 410 do not form a continuous electrical connection. Therefore current does not flow through the branch 410 in the original state.

In some embodiments, each branch 410 comprises a resistance in series with the spaced-apart conductors 420, 430. As illustrated in FIG. 1, one of the conductors 420, 430, the first conductor 420 in the illustrated embodiment, comprises a gap to allow a resistor, such as a surface mount resistor, to be soldered into the branch 410 in series with the first and second conductors 420, 430. The resistance serves to, in use, limit current flow through the branch if the conductors 420, 430 become short-circuited by metal whiskers during the test period. Furthermore, a conductance of the branch may be determined i.e. between the first and second conductors 420, 430 using the resistance in some embodiments of the invention.

The monitor means 160 is arranged to measure a voltage associated with each branch 410 of the electrical circuit 140. In particular, in some embodiments, the monitor means 160 is arranged to measure a voltage associated with the resistance of the branch 410. In one embodiment, the voltage is a voltage drop across the resistance of the branch 410, as will be explained. Each voltage measurement of the monitor means 160 may be associated with one of the branches of the electrical circuit 140 to measure the respective voltage across the resistance of the branch 410. In some embodiments, the voltage is measured at high frequency i.e. a respective voltage measurement is made at an associated point in time. The voltage may be measured at a rate of more than 500 Hz. In some embodiments, the voltage may be measured at a rate of at least 1 kHz or around 2 kHz, although other measurement frequencies may be used.

In some embodiments, the monitor means 160 may be arranged to measure one or more of the environmental characteristics within the test chamber 120. The environmental characteristics may comprise one or more of ambient air temperature within the test chamber 120, humidity within the test chamber 120, a temperature of the electrical circuit 140. Data indicative of the one or more environmental characteristics may be provided as part of the monitor signal 165 to the controller 110. It may be useful to monitor the environmental characteristics to accurately determine whether the environment accurately adopts the requested environmental characteristics.

Figure 5:
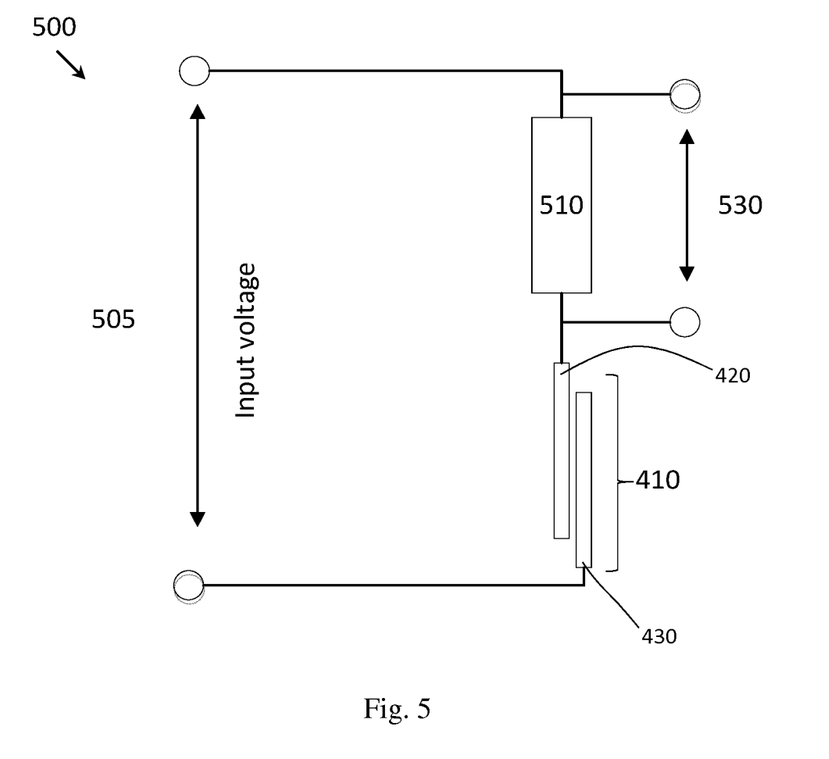
FIG. 5 shows a schematic representation of the electrical circuit according to an embodiment of the invention.

FIG. 5 is a schematic diagram 500 of the electrical circuit 140 according to an embodiment of the invention. The circuit comprises a pair of inputs 505 across which an input voltage is applied to the electrical circuit 140. The input voltage may be applied to all of the plurality of branches in the electrical circuit 140, although only one branch 410 is shown in FIG. 5 for convenience. The voltage source of the monitor means 160 may be connected across the inputs 505 to provide the input voltage. The branch 410 comprising first and second conductors 420, 430 as described above is illustrated. A resistance 510 is included in the branch in series with the conductors 420, 430 as described above. A pair of terminals 530 is illustrated across the resistance 510. However it will be appreciated that if the voltage source of the monitor means 160 provides the input voltage to the circuit 140, then only a single connection to the positive side of the resistance may be used, since if the conductors 420, 430 become short-circuit during testing, the connection to the other side of the resistance is effectively made to ground provided by the monitor means, thus a second connection may not be necessary. In use, during testing in the test chamber 120, in the original state the voltage across the resistor is zero as no current flows through the resistor 510 due to the open-circuit nature of the conductors 420, 430. However if a connection is made between the conductors 420, 430 allowing some current to flow through the branch 410, then a voltage across the resistance 510 is measured indicative of the conductance of the branch 410. In this way, the conductance of the branch 410 may be determined by the controller 110. In embodiments, where the voltage is measured at high frequency, as discussed above, even where dendrites or metal whiskers 'grow and blow' i.e. briefly form a connection between the conductors 420, 430, the formation and subsequent breaking of the connection may be determined by the controller 110.

Figure 6:
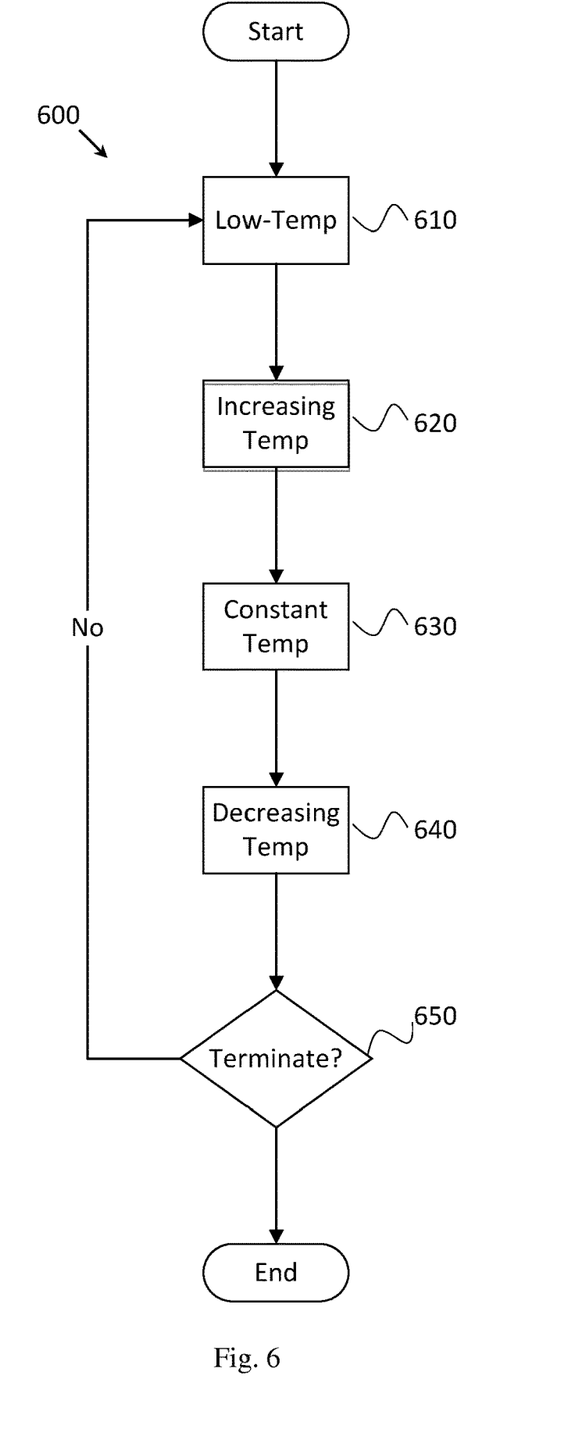
FIG. 6 illustrates a method according to an embodiment of the invention.

FIG. 6 illustrates a method 600 according to an embodiment of the invention. The method 600 is a method for testing for ECM of electrical circuits and, particularly in some embodiments, for testing for the formation of dendrites or 'metal whiskers' between metallic portions of electrical circuits. The method 600 may be implemented by the system 100 shown in FIG. 1 and described above.

Figure 7:
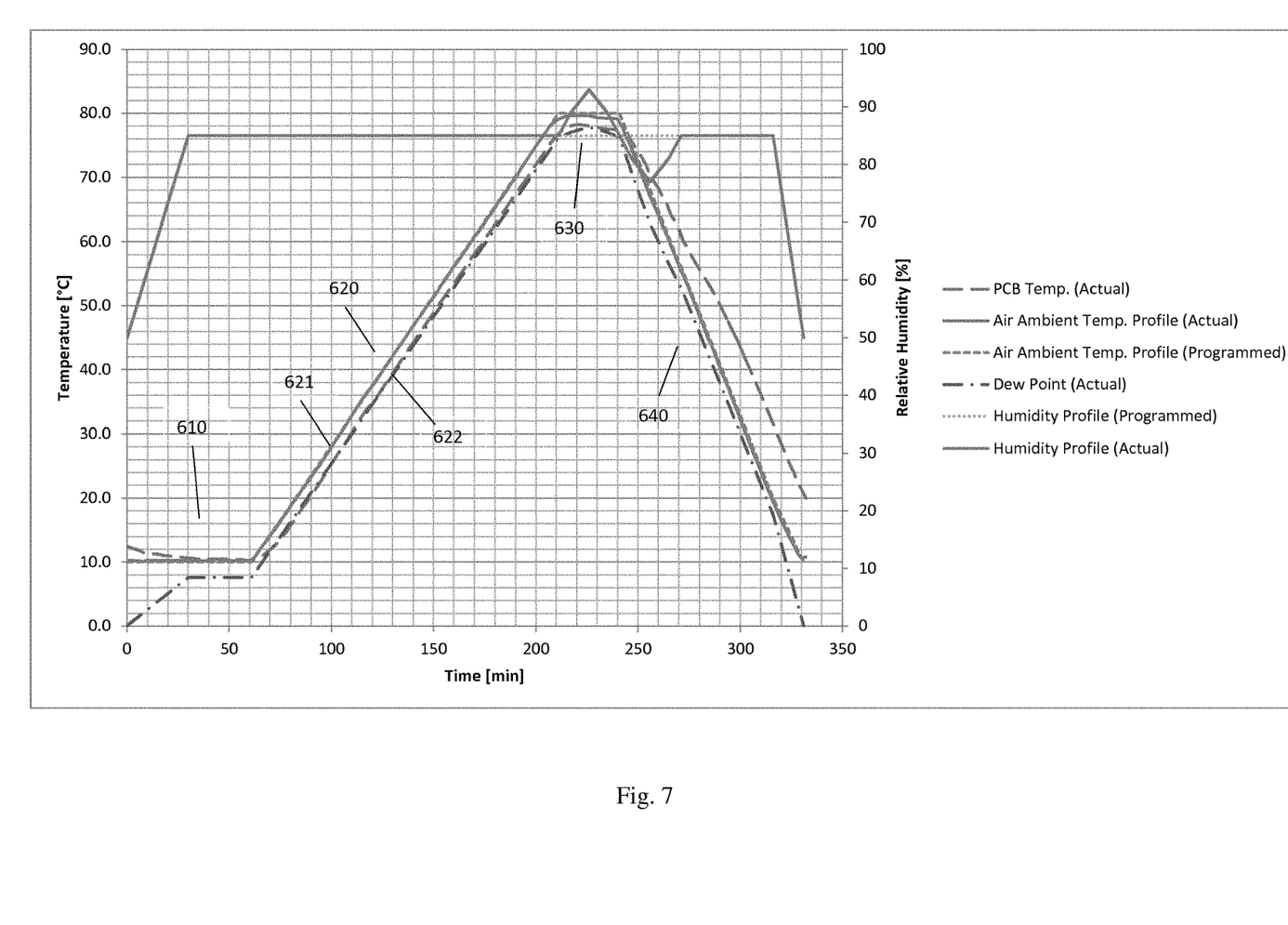
FIG. 7 is a plot of environmental characteristics according to an embodiment of the invention.

The method 600 will be described in relation to FIG. 7 which illustrates characteristics of the environment within the test chamber 120 during the test period. In particular, FIG. 7 illustrates the measured ambient air temperature within the test chamber 120, the temperature of the electrical circuit 140, the ambient air temperature as instructed by the controller 110, an estimated dew point within the test chamber 120, the humidity within the test chamber 120 as instructed by the controller 110, and the measured humidity within the test chamber 120. During the method 600 the temperature of the test chamber 120 is controlled to vary during the test period. In some embodiments, the temperature is controlled to vary according to a predetermined test profile. The predetermined test profile may be cyclically repeating i.e. repeat for a number of substantially identical cycles.

Prior to the method 600 the electrical circuit may have an electrolyte solution applied thereto. Thus the method 600 may be considered to comprise a step of applying the electrolyte solution to the electrical circuit. The electrolyte solution may comprise sodium chloride (NaCl), such as in the range 1-5.5 wt %, although other values may be used.

The method 600 comprises a step 610 of controlling the one or more environmental conditions in a first state. The first state represents a steady low-temperature state of the test chamber 120. The low-temperature state may by at an ambient air temperature of less than or equal to 25° C. In some embodiments, the ambient air temperature of the test chamber 120 may be controlled to be less than 15° C., or substantially 10° C. In some embodiments, during step 610 the humidity of the test chamber may be controlled to be relatively high which, as noted above, may be understood to mean at least 50% humidity or at least 75% humidity. In some embodiments, the humidity of the test chamber may be controlled to be substantially 80% humidity. Step 610 may have a duration of at least 30 minutes. In some embodiments, step 610 may have a duration of substantially 60 minutes, although it will be appreciated that other durations may be envisaged. Step 610 may have a duration sufficient to allow the environment within the test chamber 120 and the electrical circuit 140 to stabilise in one or more of temperature and humidity.

As illustrated in FIG. 7, during an initial part of the first state, without any preceding cycles of the method 600, the electrical circuit 140 temperature gradually decreases to approximately equal the air temperature, before assuming a stable temperature in the illustrated embodiment of around 10° C. Similarly, the humidity within the test chamber 120 gradually rises to generally above 75% humidity and, in the illustrated embodiment, assumes a constant value of approximately 85%. It is also noted that the dew point rises during the first state 610.

The method 600 comprises a step 620 of controlling the one or more environmental conditions of the test chamber 120 in a second state. The second state ("first portion" in the appended claims) is of generally increasing ambient air temperature within the test chamber 120. During the second state, the ambient air temperature may generally increase in temperature between 0.5 and 1.5° C. per minute. In some embodiments, the ambient air temperature within the test chamber 120 may generally increase in temperature at substantially 1° C. per minute, although other values may be used. Step 620 may comprise the ambient air temperature being controlled to rise to a temperature of at least 50° C. In some embodiments, the ambient air temperature is controlled to rise to a temperature of substantially 80° C., although it will be realised that other values may be used. The second state may have a duration of approximately 150 minutes, although other durations may be envisaged, particularly depending on a rate of temperature increase of one or both of the environment within the test chamber 120 and the electrical circuit 140.

Referring to FIG. 7, the actual ambient air temperature within the chamber 120 during the second state gradually rises, as expected. However, due to the association of the thermal reservoir 130 with the electrical circuit 140, the temperature of the electrical circuit 140 is caused to lag that of the ambient air temperature. In other words, during the second state a temperature differential exists there-between. The temperature of the electrical circuit 140 is approximately equal to the dew point temperature 622, or is actually slightly below the dew point temperature 622. Thus condensation is caused to form on the electrical circuit 140 during at least some of the second state. The formation of condensation on the electrical circuit may be increased by the relatively high humidity within the test chamber 120 during the second state.

The method 600 comprises a step 630 of controlling the one or more environmental conditions in a third state. The third state ("third portion" in the appended claims) is of generally constant ambient air temperature within the test chamber 120. The constant ambient air temperature may be at the maximum air temperature reached in step 620 which, as noted, in one embodiment may be substantially 80° C.

Step 630 may have a duration of at least 15 minutes. In one embodiment step 630 has a duration of substantially 30 minutes. It will be appreciated that other durations of the third state may be envisaged.

As can be appreciated from FIG. 7, when the temperature within the test chamber is controlled to remain constant, the humidity within the test chamber 120 is measured to increase and decrease. This may occur, in some embodiments, due to under-damping of control of the humidity control device.

The method 600 comprises a step 640 of controlling the one or more environmental conditions in a fourth state. The fourth state ("second portion" in the appended claims) is of generally decreasing ambient air temperature within the test chamber 120. In some embodiments, the ambient air temperature within the test chamber 120 may generally decrease in temperature at substantially 1° C. per minute, although other values may be used. Step 640 may comprise the ambient air temperature being controlled to decrease to a temperature of less than 50° C. In some embodiments, the ambient air temperature is controlled to decrease to a temperature of less than or equal to 20° C. and, in one embodiment, substantially 10° C., although it will be realised that other values may be used. The fourth state may have a duration of at least 60 minutes or around 90 minutes, although it will be realised that other durations may be used.

In FIG. 7, it can be appreciated that the temperature of the electrical circuit 140 is above the ambient air temperature within the test chamber 120 during a major portion of the third state. This temperature differential is due to the association of the electrical circuit 140 with the thermal reservoir 130 i.e. due to thermal (heat) energy being supplied to the electrical circuit 140 from the thermal reservoir 130. During this portion, condensation on the electrical circuit 140 within the test chamber 120 is substantially prevented from evaporating due to the relatively high humidity within the test chamber 120. In contrast, droplets of water on the electrical circuit may coalesce together to form larger droplets. Thus it can be appreciated that the electrical circuit 140 may be caused to be moist or wet for a period of time during the method 600, which may be a major (i.e. >50%) part of the test period.

The method 600 may comprise a step of determining whether one or more termination conditions are met. If the one or more termination conditions are met, the method 600 may end. If, however, the one or more termination conditions are not met then the method may return to step 610. The one or more termination conditions may comprise, in one embodiment, determining whether a predetermined number of cycles has been performed. The predetermined number of cycles may be 20 cycles, although other values may be used.

A method of testing an electrical circuit according to an embodiment of the invention was used to test electrical circuits having a variety of configurations. In particular, a variety of metal coatings and solder configurations, and a variety of metal configurations were tested. Tables 1 and 2 present a summary of the results which are also illustrated in FIGS. 8 and 9 respectively.

Figure 8:
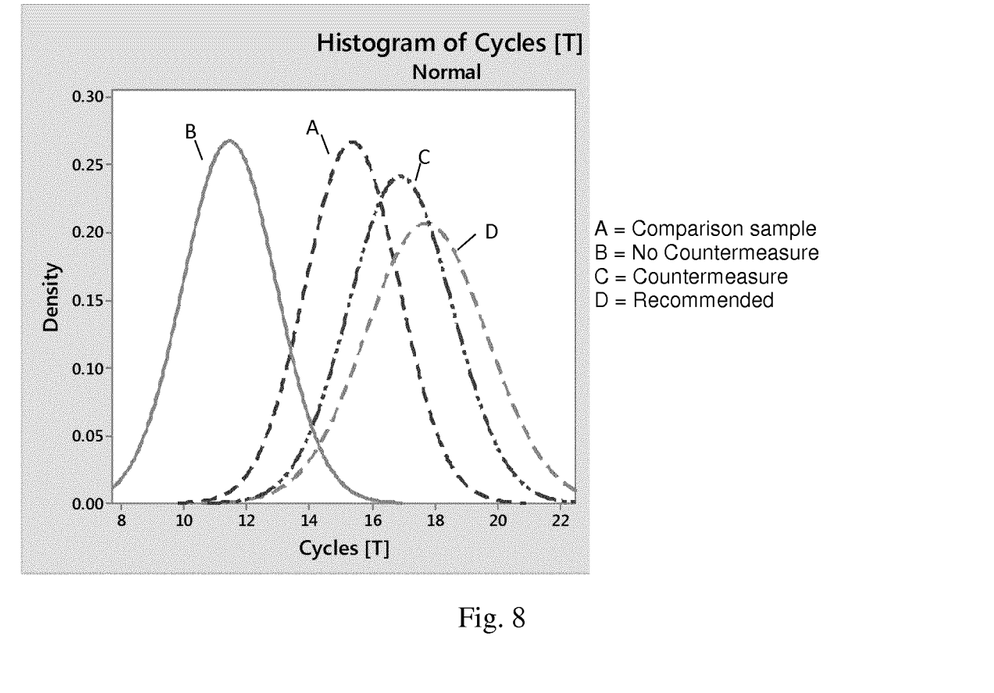
FIG. 8 is a plot of histograms of failure cycles of a variety of electrical circuit configurations.
Figure 9:
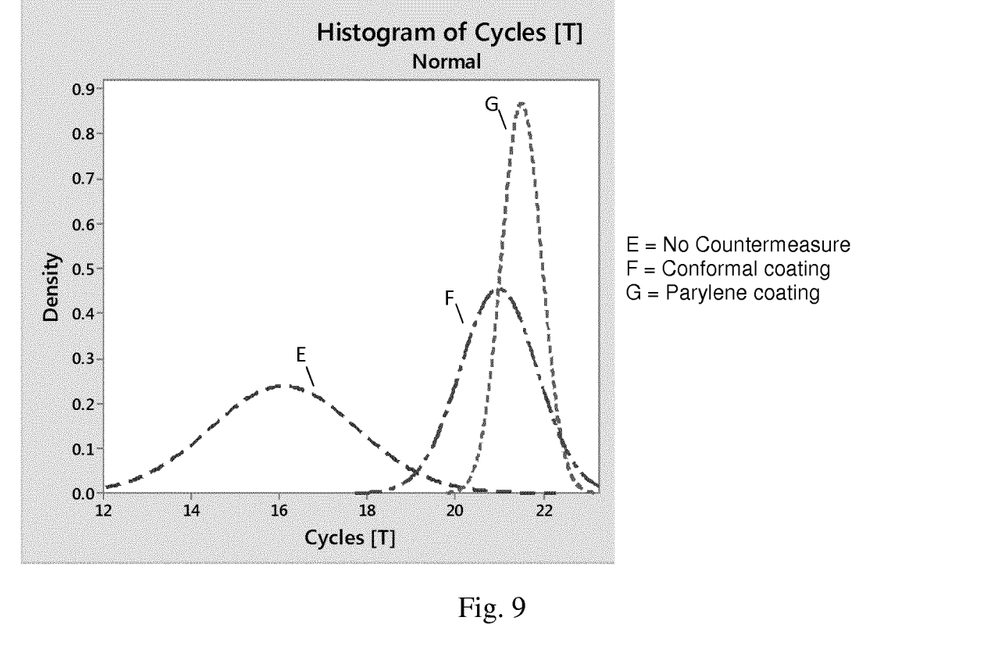
FIG. 9 is a further plot of histograms of failure cycles of a variety of electrical circuit configurations.

Referring to Table 1 and FIG. 8 corresponding to the variety of metal coatings and solder configurations, four configurations were tested labelled A-D. The configurations were applied to a PCB having metallic tracks. It will be appreciated, however, that embodiments of the present invention are not limited to PCBs. Each PCB had copper tracks on a backing board, in one case (D) having a layer of tin applied thereto. A variety of solders having in some cases different compositions were applied to at least portions of the tracks. In one case (C) the metal tracks had a conformal coating applied thereto. In this test the tracks had a spacing of 1 mm. An applied voltage during the test was in the range 12 to 30 Volts. An electrolyte solution may be applied to the PCB prior to the test to stimulate ECM during the test. The electrolyte solution may comprise sodium chloride (NaCl), such as in the range 1-5.5 wt %, although other values may be used.

TABLE 1

Solder in electrical circuit

| Condition | A | B | C | D |
|---|---|---|---|---|
| Solder | Pb | Sn/Ag/Cu | Sn/Ag/Cu | Sn/Cu |
| Trace | Cu | Cu | Cu | Sn on Cu |
| Coating | No | No | Conformal | No |
| Mean (cycles)* | 15.37 | 11.45 | 16.91 | 17.73 |
| SD | 1.493 | 1.49 | 1.652 | 1.928 |

*Mean (cycles) in Table 1 above, and Table 2 below, indicates a mean number of cycles to failure.

The Sn/Ag/Cu solder may have a composition of Sn, 3-4 wt % Ag and 0.5-0.9 wt % Cu where Sn is a base metal having a balance wt % i.e. being a remainder of the composition. The Sn/Cu solder may have a composition of 99Sn, 0.7Cu, 0.07Ni, 0.01Ge. The amounts may be weight percentage (wt %). The Cu may have a thickness of approximately 35 μm, the Sn may have a thickness of 1 μm on the Cu. The conformal coating may by an acrylic coating, such as applied by aerosol.

As can be appreciated from the above Table 1 and FIG. 8, an electrical circuit without ECM countermeasures (B) fails most quickly. The electrical circuit using lead (Pb) solder improves upon the no-countermeasure case (B), but is unsuitable for use in vehicles due to comprising lead (controlled under the Restriction of Hazardous Substances Directive 2002/95/EC, (RoHS 1)). An electrical circuit with an ECM countermeasure in the form of a conformal coating (C) offers better results, i.e. lasts a greater number of cycles, but incurs an approximate cost increase of 8% and additional weight of the conformal coating which, on large numbers of electrical circuits in a vehicle, may be substantial. However it can be appreciated that use of copper plated with tin and tin/copper solder as in configuration D offers an improvement over configuration C, but without the cost and/or weight increase of the conformal coating.

The use of solder in configuration D including a small amount of nickel improves wetting, furthermore the use of solder without silver, i.e. wherein the solder is substantially free of silver, is believed to improve a resistance to ECM. Furthermore, Sn has a higher ionic activation energy than Cu, thus is less prone to ECM. By substantially free of silver it is meant that in some embodiments the silver content of the solder is less than 0.1 wt %.

Figure 10:
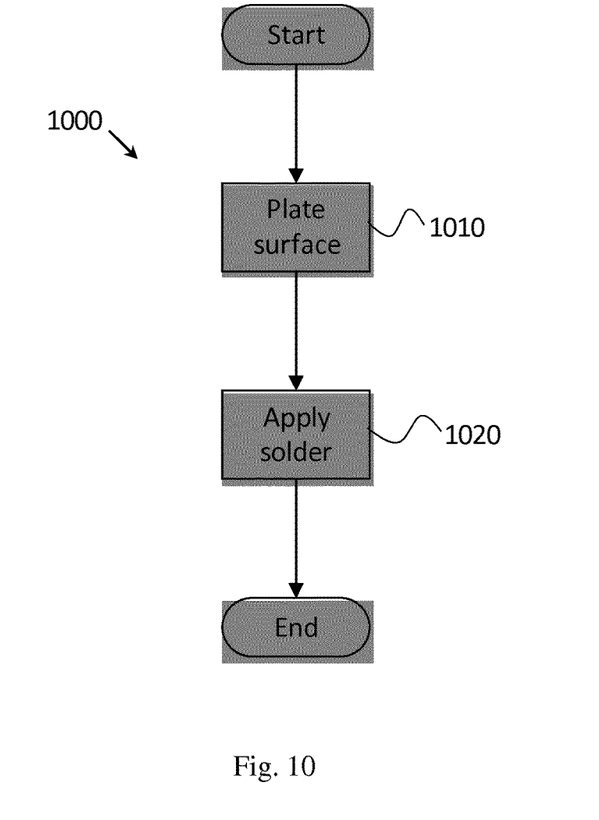
FIG. 10 is a method according to another embodiment of the invention.

Embodiments of the present invention thus provide a method 1000 of assembling an electrical circuit, an embodiment of which is illustrated in FIG. 10. Although not specifically illustrated, the method 1000 may comprise a step of forming one or more copper electrical conductors, for example by etching metallic material from selected portions of a metallic layer disposed on an insulating substrate, such as polyamide or FR4 material.

The method 1010 comprises a step 1010 of plating a surface of the one or more conductors with a layer comprising tin.

The tin plating may be immersion tin plating to achieve a thickness of tin of less than or equal to 5 µm. In some embodiments, the tin may be plated to have a thickness of less than or equal to 2 µm and, in particular, a thickness of around 1 µm in some embodiments, where 'around' may mean ±10%. The tin plating may be annealed at an effective metal temperature of above 200° C. and, in some embodiments, at least 225° C. or around 255° C. The annealing may be performed for at least an hour.

The plated electrical circuit may then not be subject to a force cool. In other words, the electrical circuit may be allowed to cool naturally at room temperature, which may be in the range of 10 to 40° C. Thus a cooling rate of the electrical circuit following the annealing of the plating may be performed at a rate of less than 5° C./minute or 4° C./minute. The rate of cooling may be greater than 1° C./minute. The electrical circuit may be cooled following the annealing at a rate within a range of 1.8° C./minute to 3° C./minute.

The method 1000 comprises a step 1020 of applying solder to at least a portion of the one or more electrical conductors, wherein said solder comprises tin and copper. The solder may be applied to selected portions of the electrical circuit using a mask.

The solder may be at least 95 wt % tin and, in one embodiment, the solder may be around 99 wt % tin. The solder may comprise copper in the range 0.5 wt % to 1 wt %. The solder may comprise around 0.7 wt % copper. The solder optionally comprises nickel in a range of 0.1 to 0.05 wt %. The solder may comprise germanium. The solder may comprise germanium in the range 0.005 to 0.02% wt. In one embodiment the solder has a composition of 99Sn, 0.7Cu, 0.07Ni, 0.01Ge.

The solder may be applied to the at least a portion of the one or more electrical conductors and subjected to an annealing process at a maximum temperature of around 150° C. The annealing process may have a duration of less than or equal to 1.5 hours and, in particular in one embodiment, be around 1 hour. Following the anneal, the electrical circuit may be allowed to cool at room temperature, which may be in the range of 10 to 40° C. i.e. the electrical circuit is not subject to a force cool. Thus a cooling rate of the electrical circuit following the annealing of the solder may be performed at a rate of less than 5° C./minute or 4° C./minute. The rate of cooling may be greater than 1° C./minute. The electrical circuit may be cooled following the annealing of the solder at a rate within a range of 1.8° C./minute to 3° C./minute.

The method 1000 may also comprise applying flux to the electrical circuit. The flux may be applied prior to the application of the solder. It has been observed that a choice of flux may be influential on a susceptibility of the electrical circuit to ECM. In particular, it has been observed that rosin based flux types are less likely to trigger ECM, especially when not removed from the electrical circuit. Rosin based flux types are less hygroscopic e.g. compared to water-based flux, and are thus likely to lead to ECM. Furthermore, it has been observed that a choice of low residue flux may be less likely to interact with a substrate of the electrical circuit and any coatings. In some embodiments, the flux may be a substantially halide free flux, such as of less than 0.5% halide content. The flux may be a no-clean flux i.e. one which does not require cleaning. However no-clean fluxes may be volatile and/or undergo thermal decomposition. Thus, in some embodiments, a cleaning step may be performed even in combination with use of a no-clean flux. The cleaning step may be use of an aqueous-based cleaning medium, such as Zeston® Vigon® or similar.

A reflow temperature of the flux may substantially correspond to the temperature of the annealing of the electrical circuit having the solder applied. In this way, the flux is caused to better cover the electrical circuit to assist in preventing oxidisation.

The combination of materials and processing steps in some embodiments provides a higher metal ion activation energy and low compressive stresses formed in the electrical circuit which may improve a resistance to ECM.

Table 2 and FIG. 9 illustrate test results of metal conductors and coatings. Three configurations were tested labelled E-F.

TABLE 2

| Circuit metal and coatings | | | |
|---|---|---|---|
| Condition | E | F | G |
| Trace | Cu | Sn on Cu | Cu |
| Coating | No | Conformal | Parylene |
| Mean (cycles)* | 16.1 | 21 | 21.52 |
| SD | 1.673 | 0.8767 | 0.459 |
| Sensor | 0 | 3 | 3 |

The parylene may be Parylene C. The Cu may have a thickness of approximately 35 µm, although other thicknesses may be envisaged.

As can be appreciated from the above Table 2 and FIG. 9, an electrical circuit without ECM countermeasures (E), i.e. having bare copper PCB tracks, fails most quickly. An electrical circuit with an ECM countermeasure in the form of a conformal coating (F) on copper tracks offers better results over no countermeasures (E), i.e. lasts a greater number of cycles, but as noted above may incur a cost and/or weight penalty. Configuration G including copper PCB tracks coated with parylene offers a greater mean number of cycles to failure through ECM and a smaller standard deviation of failure cycles than configuration F.

As can be appreciated, some embodiments of the present invention provide a method and apparatus for testing electrical circuitry, particularly for failure caused by ECM. Some embodiments of the present invention provide electrical circuitry having at least some resistance to ECM, whilst potentially offering cost and/or weight savings over the use of conformal coatings.

Figure 11:
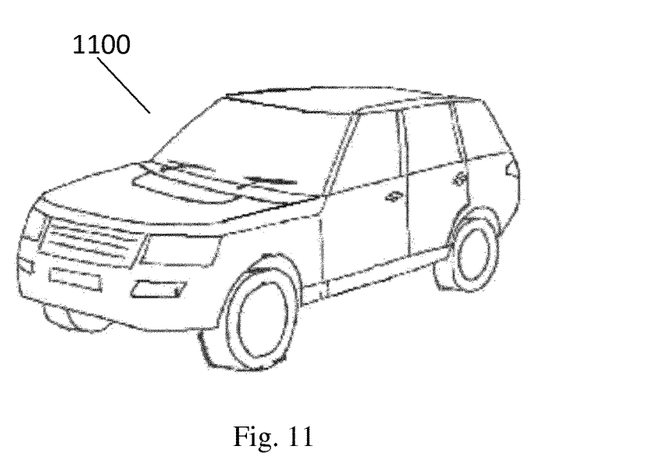
FIG. 11 is a vehicle according to an embodiment of the invention.

Embodiments of the invention comprise an electrical circuit produced by a method according to an embodiment of the invention. The electrical circuit may be included within a vehicle 1100, such as illustrated in FIG. 11. The vehicle 1100 may be a land-going vehicle, as illustrated, although other vehicles such as aircraft and watercraft are also envisaged.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. A method of assembling an electrical circuit comprising one or more copper electrical conductors, the method comprising:
    plating a surface of the one or more conductors with a layer comprising tin;
    applying solder to at least a portion of the one or more electrical conductors, wherein said solder comprises tin and copper and is substantially free of silver; and
    annealing the electrical circuit having the solder applied to the at least a portion of the one or more electrical conductors at a temperature of up to around 150° C.

2. The method of claim 1, wherein the annealing of the electrical circuit having the solder applied has a duration of between 45 minutes and 1.5 hours.

3. The method of claim 1, comprising allowing the electrical circuit to cool following the annealing in an atmosphere at a temperature within a range of 10 to 40° C.

4. The method of claim 1, comprising cooling the electrical circuit following the annealing at a rate within a range of 1.8° C./minute to 3° C./minute.

5. The method of claim 1, wherein the solder comprises copper in a range from 0.5 wt % to 1 wt %.

6. The method of claim 1, wherein the solder is at least 95 wt % tin.

7. The method of claim 1, comprising applying a rosin-based flux to the electrical circuit.

8. The method of claim 7, wherein a reflow temperature of the flux corresponds to the temperature of the annealing.

9. An electrical circuit, comprising:
    one or more copper electrical conductors having a tin plating; and
    solder comprising tin and copper applied to at least a portion of the one or more electrical conductors and annealed at a temperature of up to around 150° C., wherein the solder is substantially free of silver.

10. The electrical circuit of claim 9, wherein the solder comprises copper in a range from 0.5 wt % to 1 wt %.

11. The electrical circuit of claim 10, wherein the solder comprises around 0.7 wt % copper.

12. The electrical circuit of claim 9, wherein the solder comprises nickel in a range of 0.1 to 0.05 wt %.

13. The electrical circuit of claim 9, wherein the solder is at least 95 wt % tin.

14. The electrical circuit of claim 9, wherein the solder comprises Germanium.

15. The electrical circuit of claim 9, wherein the tin plating has a thickness of less than or equal to 5 µm.

16. The electrical circuit of claim 15, wherein the tin plating thickness is less than or equal to 2 µm.

17. The electrical circuit of claim 15, wherein the tin plating thickness is around 1 µm.

18. The electrical circuit of claim 9, wherein the one or more copper conductors are without a conformal coating.

19. A vehicle comprising the electrical circuit of claim 9.

20. The method of claim 1, wherein applying the solder is subsequent to the plating.

* * * * *